United States Patent [19]

Bagno Robert G.

[11] Patent Number: 4,999,059

[45] Date of Patent: Mar. 12, 1991

[54] UNIVERSAL SOLAR CONCENTRATOR PANEL

[76] Inventor: Bagno Robert G., 274 Pulaski Rd., Kings Park, N.Y. 11754

[21] Appl. No.: 392,652

[22] Filed: Aug. 11, 1989

[51] Int. Cl.⁵ .......................................... H01L 31/058
[52] U.S. Cl. .................................. 136/248; 126/438; 136/246
[58] Field of Search ............... 136/246, 248; 126/424, 126/438

[56] References Cited

U.S. PATENT DOCUMENTS

| 2,946,945 | 7/1960 | Regnier et al. | 320/2 |
| 3,643,648 | 2/1972 | Tarcici | 126/424 |
| 3,713,727 | 1/1973 | Markosian et al. | 350/636 X |
| 3,797,476 | 3/1974 | Tarcici | 126/424 |
| 3,998,206 | 12/1976 | Jahn | 60/641.15 X |
| 4,110,010 | 8/1978 | Hilton | 350/613 |
| 4,252,107 | 2/1981 | Horton | 126/438 |
| 4,295,462 | 10/1981 | Bunch | 126/424 |
| 4,347,834 | 9/1982 | York | 126/424 |
| 4,395,581 | 7/1983 | Girard | 136/246 |
| 4,457,297 | 7/1984 | Sobczak et al. | 126/424 |
| 4,458,670 | 7/1984 | Lhenry | 126/424 |
| 4,463,749 | 8/1984 | Sobczak et al. | 126/451 |
| 4,612,913 | 9/1986 | Mori | 126/438 |

FOREIGN PATENT DOCUMENTS

| 2440526 | 7/1980 | France | 126/425 |
| 2000319 | 1/1979 | United Kingdom | 126/425 |
| 2016675 | 9/1979 | United Kingdom | 126/424 |

Primary Examiner—Aaron Weisstuch

[57] ABSTRACT

A solar concentrator device has a solar energy receiver and a solar energy reflector including a plurality of individual panels turnable about two mutually perpendicular axes so that the panels in one row are jointly turnable about a first axis, the panels in the same row are turnable also relative to two further axes.

9 Claims, 5 Drawing Sheets

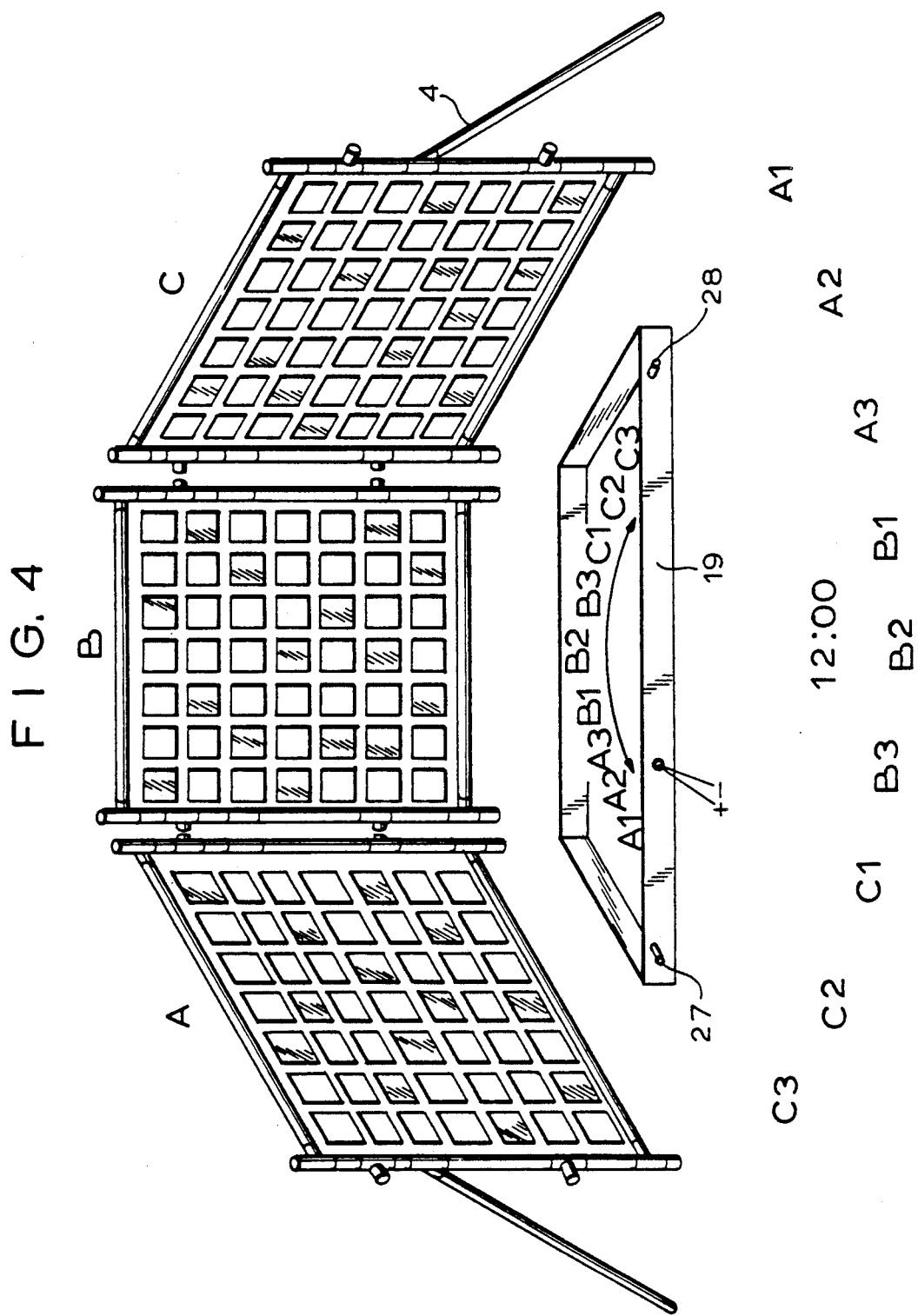

UNIVERSAL SOLAR CONCENTRATOR PANEL

BACKGROUND OF THE INVENTION

The present invention relates to solar concentration panels.

Solar concentration panels are generally known in the art. Some of such solar concentration panels are disclosed in U.S. Pat. Nos. 3,643,648; 3,713,727; 3,797,476; 3,998,206; 4,252,107; 4,295,462; 4,347,834; 4,457,297; 4,458,670 and 4,463,749. They are also disclosed in French Patent No. 2,440,256, and British Patents Nos. 2,00,319 and 2,016,675. The known solar concentration panels can be further improved.

BRIEF SUMMARY OF THE INVENTION

In accordance with the present invention, a universal solar concentrator panel consists of many identical flat square reflective panels, with a plastic tubular support structure. The panels are mass produced and mounted on a multiple rotating axes support so that the individual reflective panels can move up, down and right, left, thus enabling a focal point to move independent of its support structure. This will allow for many panels to be joined together to increase the size of the concentrator system. A receiver is provided with support and tracking means to optimize performance of the concentrator system. The following are improvements over prior designs of the cited references:

(a) The concentrator comprises a flat reflective panel. All prior designs are of curved, parabolic or spherical type reflectors. These types of reflective surfaces are very expensive to make and do not work well in diffused light.

(b) The support structure consists of light weight plastic tubing. Plastic is an abundant material, strong, light, inexpensive and can last forever. No prior designs are of this type of construction.

(c) The design allows for movement of its focal point independently from its support structure. This allows for universal application of concentrator panels. They can be used with a tracking system or without, by means of setting panels up in a half or whole circle with a stationary receiver placed on the ground in front of it. All panels focal images are aimed at the same receiver, but only those panels opposite the sun will reflect an image at a time.

(d) The solar energy receiver makes 100% conversions of all levels of solar radiation. The receiver converts solar energy into both hot water heat and electrical energy simultaneously. Unlike prior designs, conversions are made in cloudy or hazy conditions. This is possible due to the combined use of flat reflective panels and photo voltaic cells which both can perform well on poor condition days. The cells are sealed in clear pastic and submerged in water. The water acts as a heat transfer fluid and a coolant for the photo cells. All prior designs are intended for use of a steam or stirling A/B compressed gas engines, which will only run under perfectly sunny days.

BRIEF DESCRIPTION OF DRAWINGS

FIG. 4 illustrates the universal concentrator panel used without tracking means.

DETAILED DESCRIPTION OF INVENTION

Figure 1:
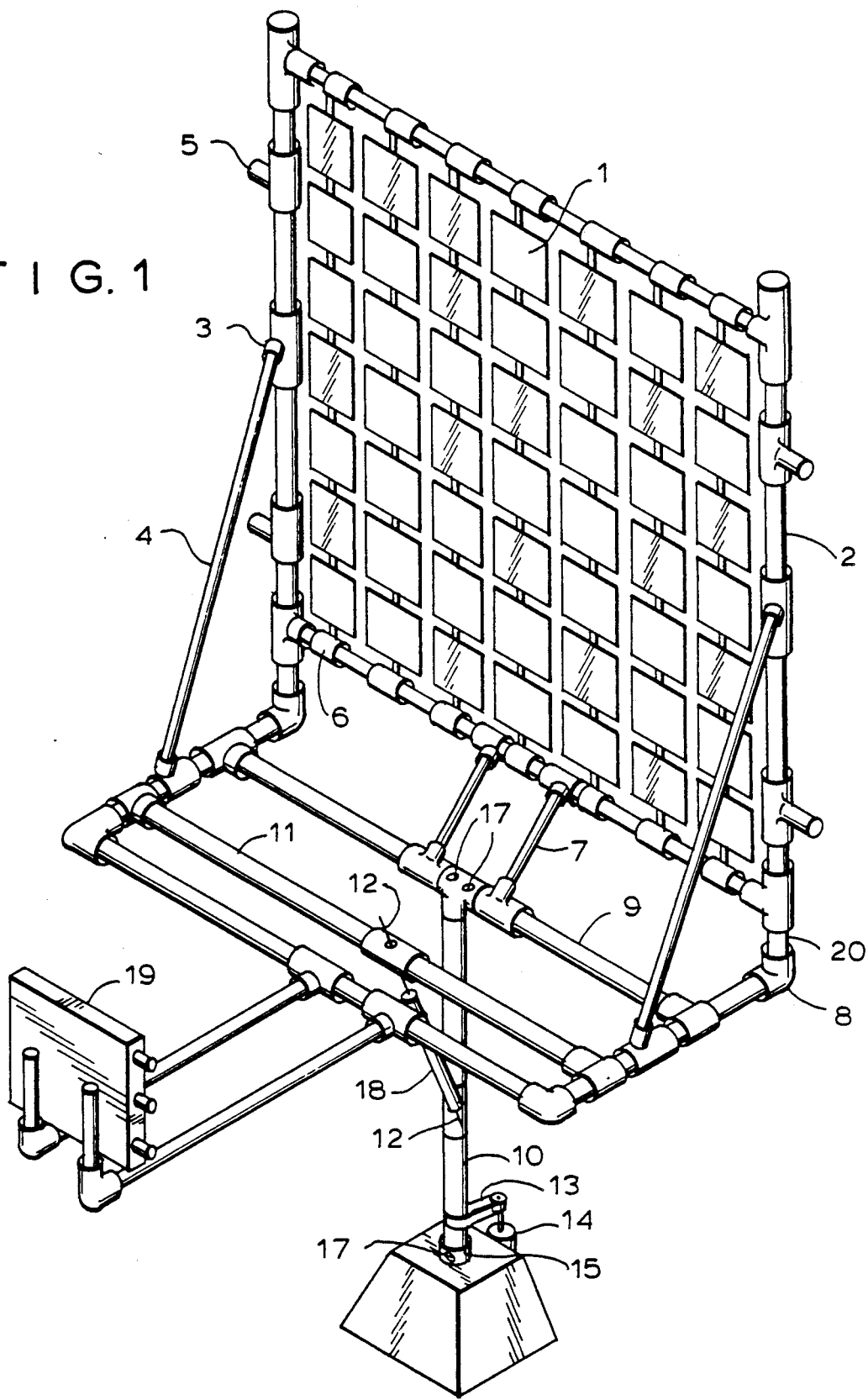
FIG. 1 illustrates a universal solar concentrator panel with tracking and receiver support means.
Figure 3:
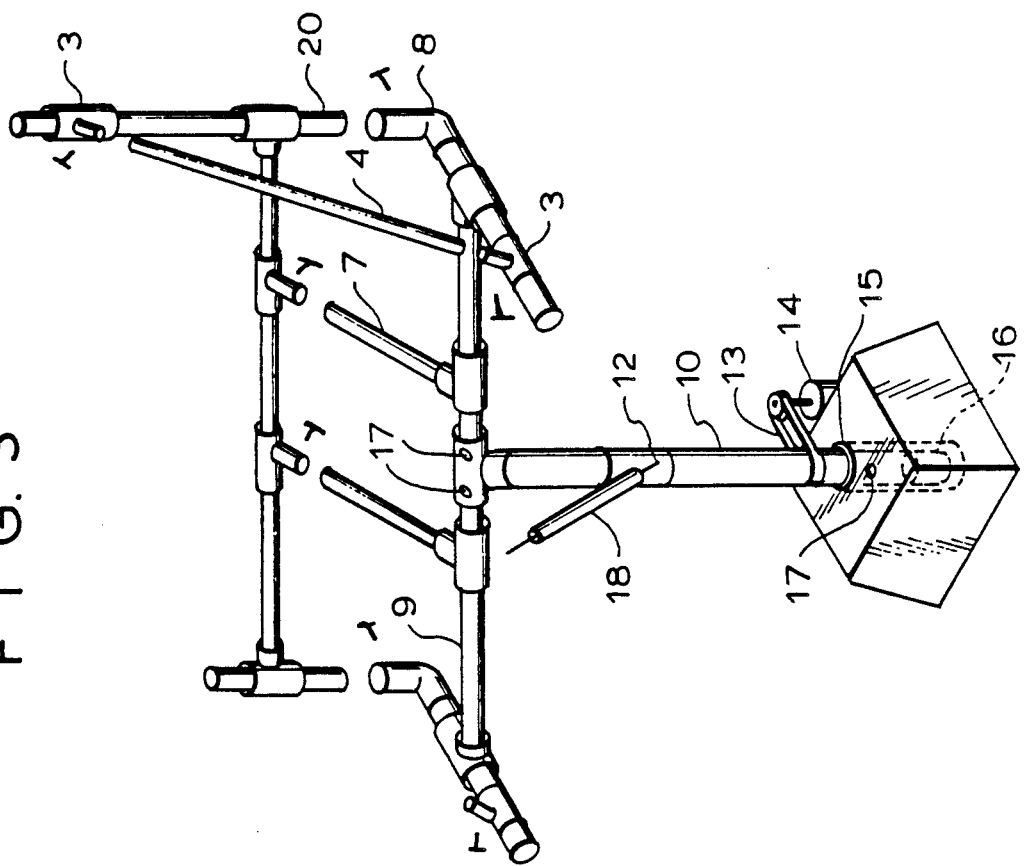
FIG. 3 is a partial isometric drawing of a connection of the universal solar concentrator panel and tracking means.
Figure 2:
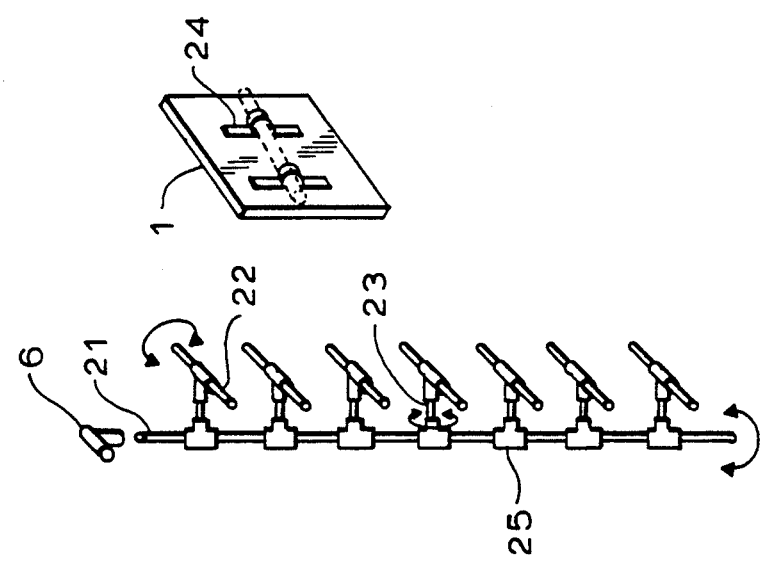
FIG. 2 is a detailed drawing of a triple rotating axis reflector support assembly of the invention.
Figure 5:
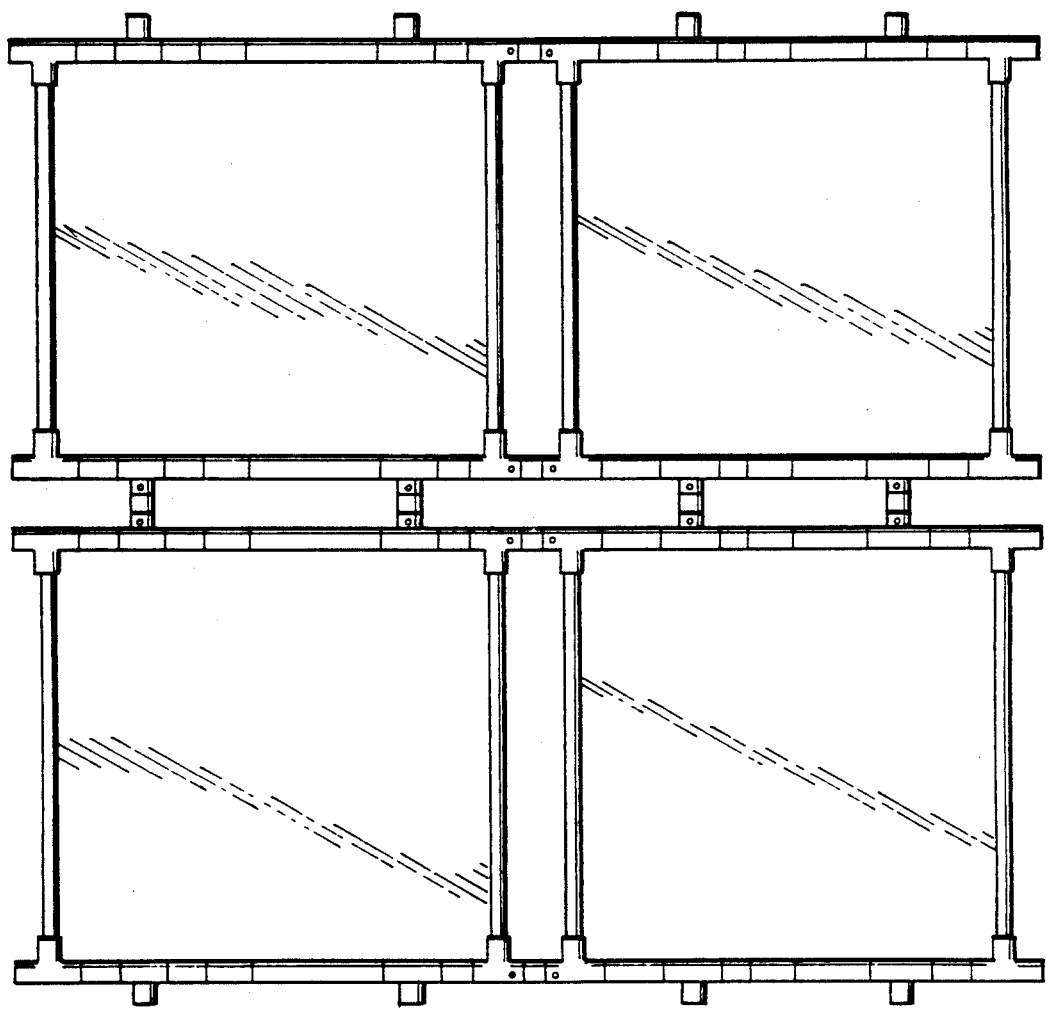
FIG. 5 illustrates how the individual concentrator panels can be joined together.

FIGS. 1-3 are used to illustrate the main embodiment and function of the Universal Solar Concentrator Panel. FIG. 1 illustrates that the concentrator panel is composed of many individual flat mirror reflective panels 1, which adhere to a metal or plastic substrate and by means of pipe straps 24 are mounted on a triple rotating axis assembly (FIG. 2). Horizontal axle 22 allows up and down adjustment of individual reflective panels 1, and by means of set screws through the pipe strap 24 and the axle 22 the adjustment can be held permanent. The horizontal axle 22 is then connected perpendicularly to a horizontal axle 23, by means of a tee fitting which allows for rotational adjustment of the axle 22 around the axle 23, and then held permenant by means of a set screw through a tee fitting and the axle 23. The purpose of this adjustment is to correct image formation of a square at the focal point of a square aperture of a solar energy receiver 19. Because of compound angling necessary of reflective panels furthest away from the focal point, the image of a square reflective panel begins to circulate about the focal point, so that by turning axis 22 the image can be brought back to a square. Spaces are left between the individual reflectors 1 for both rotational adjustment and wind deterring reasons. Both axles 22 and 23 are then connected in series to a main vertical axle 21 of a larger diameter size tubing by means of size increasing tee fitting 25. A series of the vertical axles 21 assemblies are then connected to a main frame 2 by means of a size increasing tee fitting 6, which allows for rotational adjustment of the axle 21 of right and left, and/or in and out. This adjustment is then held permenant by means of a set screw through a tee fitting 6 and the axle 21. Also incorporated in the main frame 2 are 45 degree tee fittings 3 which are used for support legs 4. An additional eight tee fittings 5 are also incorporated in the main frame 2 for the option of connecting additional solar concentrator panels together as illustrated in FIG. 5. FIG. 1 illustrates the universal solar concentrator panel with use of a tracking and receiver support means to correctly focus the sun at the receiver 19. FIG. 3 illustrates how quickly the concentrator panel connects to the tracking and receiver support means with four bolts through the support legs 4 and 45 degree tee fitting 3, two bolts through an extension pipe 20 and elbow fitting 8 of tracking system, and still another two bolts through the support legs 7 and size decreasing tee fitting 6, eight bolts in total. The tracking and receiving support structure is composed of light weight tubular plastic with all elbows and tee fittings glued and or screwed together. As seen in FIG. 1, the concentrator panel is just behind main horizontal axle 9 and vertical axle 10 of tracking means for balance of the receiver 19 and its support structure. Unlike prior designs of curved, spherical or parabolic shapes, the universal solar concentrator panel is flat in design, therefore not requiring counter weights for balance, thus lightening the load on tracking energy requirements.

Another improvement of the present inventions tracking and support structure is that there are no obstructing support members for the receiver support that would otherwise interfere with incoming light. The up and down adjustment of the tracking means is accomplished by a hydraulic cylinder 18, mounted to horizontal beam 11 and the vertical axle 10 with the aid of steel reinforcement plates 12 at both ends. The right to left adjustment of tracking means is accomplished by means of a hydraulic motor 14 with a belt 13 that turns the vertical axle 10 independent of concrete vertical support tube 15. Enclosed inside the bottom of the support tube 15 is a steel ball for the vertical axle 10 to rest on. Oil holes 17 are added to reduce friction. Both the hydraulic cylinder 18 and the hydraulic motor 14 are controlled by means of a computer control box not shown.

FIG. 4 illustrates the universal solar concentration panel without the use of a tracking system where panel A faces southeast, panel B south, and panel C facing southwest with the receiver 19 on the ground in front of panels. Panels are free standing with the support legs 4. In this manner the panels and the receiver are kept stationary and focal images are free to travel along an oversized receiver 19, rather than entire system having to move to correctly aim the reflected image at the receiver 19. FIG. 4 illustrates with use of letters and numbers the sun's location A1, A2, A3, B1, B2, B3, C1, C2, and C3 throughout the course of the day. The letters indicate which corresponding panel is reflecting an image and the numbers indicate the different locations of that panels image. The receiver 19 has corresponding image plotted throughout the course of the day. For example, when the sun is at A1 the panel A reflects a focal image where it is marked on receiver A1, when the sun is at A2 the panel A reflects a focal image A2 on the receiver, when the sun is at A3/B1 both panels A/B reflect an image as marked on receiver, when the sun is at position B2, the panel B reflects an image as marked on the receiver and the panel A becomes obsolete, when the sun is at B3/C1 both panels B/C reflect a focal image as marked on the receiver, when the sun is at C2 the panel C reflects an image and the panel B becomes obsolete, and when the sun is at final location C3, the panel C reflects its focal image as marked. So in conclusion, the focal point of each panel projects a concentrated image at the same receiver at different times of the day. This is made possible due to the adjustable focal point where the adjustment is performed so that all panel's focal images are placed in the same proximity of receiver. Since the universal solar concentrator panel is designed to be of low cost and massproducible, the use of extra panels should not exceed the cost of a tracking system and the energy requirements for such tracking are omitted.

Figure 6:
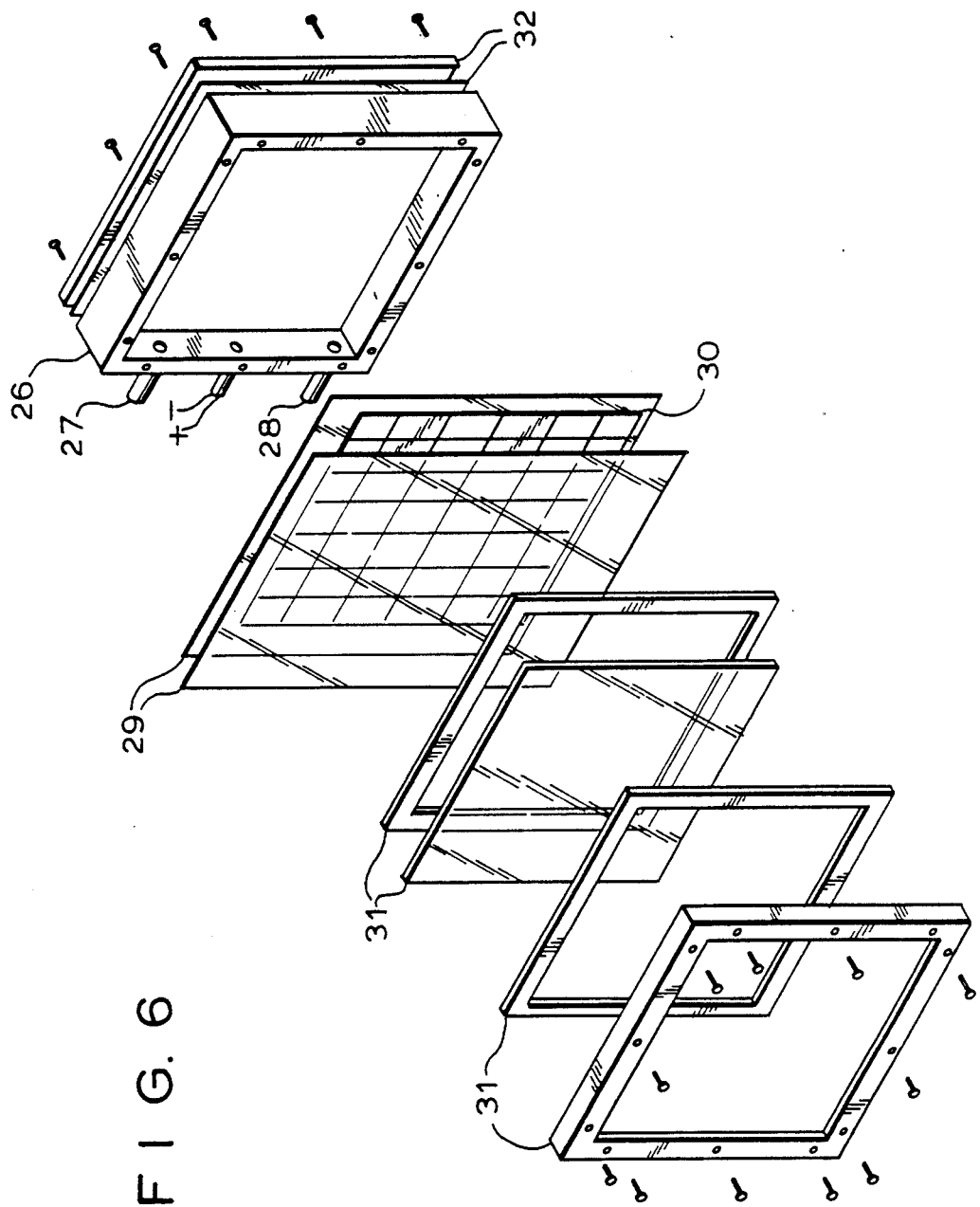
FIG. 6 is an exploded isometric drawing of a solar energy receiver.

The solar energy receiver of the present invention is of new design, whereby it converts solar energy into both hot water heat and electrical energy simultaneously. The reason for this type of receiver is that it can produce energy conversions of 100 %, even on hazy or partly cloudy days. All prior designs can only function on perfect conditions of limited days, and incorporate steam turbines or Stirling A/B compressed gas engines which require perfect conditions to run. FIG. 6 illustrates an exploded isometric drawing of solar energy receiver 19, which shows the receiver is composed of an open chamber box 26 with a water inlet 27 and a water outlet 28. Enclosed in hermetically sealed clear plastic 29 are state of the art photovoltaic cells (PVCs) 30. The present invention utilizes amorphous silicon, but stacked or tandem types of greater efficiency are prefered. Photovoltaic cells are then submerged in water inside chamber 26 when the glass cover and rubber seals 31 along with back cover and rubber seals 32 are sealed. By combining water with hermetically sealed (PVCs), concentrated levels of solar radiation can be applied without damage to the (PVCs). A second purpose of the water is that it can be used as a heat tranfer fluid to heat domestic hot water and or hot air heat exchange for home heating. The receiver of present invention is composed of aluminium and ¼ inch heat resistant glass to permit weatherability.

What ic claimed is:

1. A solar concentrator device comprising a solar energy receiver; and a flat solar energy reflector arranged to reflect solar energy to said receiver, said reflector including a substantially square-shaped frame limiting an inner space, a plurality of individual flat reflective panels arranged in said space in a first group or rows extending in a first direction and a second group of rows extending in a second direction substantially transverse to said first direction and so that each of said panels is turnable about three mutually perpendicular axes, and means for mounting said panels so that they are turnable about said axes, said mounting means, including first means which connect said panels in said rows extending in one of said directions so that said panels in each of said rows extending in said one direction are jointly turnable about a first one of said axes, second means for mounting each of said panels so that in each of said rows extending in said one direction each of said panels is turnable about a second one of said axes, and third means for mounting each panel in each of said rows extending in said one direction so that each of said panels is turnable about a third one of said axes.

2. A solar concentrator device as defined in claim 1, wherein said frame has two opposite pairs of frame members, said first means including a plurality of elongated mounting members extending between and connected with said frame members of one of said pairs of said frame members and each supporting said panels of one of said rows extending in said one direction, said elongated mounting members being turnable relative to said frame members of said one pair about said first axis.

3. A solar concentrator device as defined in claim 2, wherein said frame and said elongated mounting member are formed by plastic tubes.

4. A solar concnetrator device as defined in claim 1, wherein said second means includes a second mounting member connected with each of said panels and with a respective one of said elongated mounting members and turnable relative to the latter about said second axis.

5. A solar concentrator device as defined in claim 4, wherein each of said second mounting members includes a first portion fixedly connected with a respective one of said mounting members and a second portion connected with a respective one of said panels and turnable relative to said first portion about said second axis.

6. A solar concentrator device as defined in claim 5, wherein said first portion includes an elongated piece having two ends and a tee provided on one of said ends and fitted over a respective one of said mounting members, said second portion having a tee fitted on the other of said ends of said elongated piece and connected with a respective one of said panels.

7. A solar concentrator device as defined in claim 6, wherein said third means includes an axle connected with said second mentioned tee, and at least one bracket fixedly connected with a respective one of said panels and turnable over said axle about said third axis.

8. A solar concentrator device as defined in claim 1, wherein said receiver includes a box forming an inner chamber, a plurality of photovoltaic cells sealed with a clear plastic and accommodated in said chamber, and water filling said chamber and surrounding said photovoltaic cells.

9. A solar concentrator device as defined in claim 1, wherein said frame is provided with connecting means for connecting to a frame of other such reflectors.

* * * * *